United States Patent
Wu et al.

(10) Patent No.: US 10,310,380 B2
(45) Date of Patent: Jun. 4, 2019

(54) HIGH-BRIGHTNESS LIGHT SOURCE

(71) Applicant: Taiwan Semiconductor Manufacturing Co., Ltd., Hsinchu (TW)

(72) Inventors: Tsiao-Chen Wu, Jhudong Township, Hsinchu County (TW); Chun-Lin Louis Chang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/632,500

(22) Filed: Jun. 26, 2017

(65) Prior Publication Data
US 2018/0157179 A1   Jun. 7, 2018

Related U.S. Application Data

(60) Provisional application No. 62/430,965, filed on Dec. 7, 2016.

(51) Int. Cl.
*G03F 7/20* (2006.01)
*H05G 2/00* (2006.01)

(52) U.S. Cl.
CPC ......... *G03F 7/70033* (2013.01); *H05G 2/003* (2013.01); *H05G 2/006* (2013.01); *H05G 2/008* (2013.01)

(58) Field of Classification Search
USPC .................................................... 250/504 R
See application file for complete search history.

(56) References Cited

U.S. PATENT DOCUMENTS

| 7,928,416 | B2* | 4/2011 | Fomenkov | H05G 2/003 |
| | | | | 250/504 R |
| 8,368,039 | B2* | 2/2013 | Govindaraju | H05G 2/008 |
| | | | | 250/504 R |
| 8,764,995 | B2 | 7/2014 | Chang et al. | |
| 8,796,666 | B1 | 8/2014 | Huang et al. | |
| 8,809,818 | B2* | 8/2014 | Murakami | G03F 7/70033 |
| | | | | 250/504 R |
| 8,828,625 | B2 | 9/2014 | Lu et al. | |
| 8,841,047 | B2 | 9/2014 | Yu et al. | |
| 8,877,409 | B2 | 11/2014 | Hsu et al. | |
| 8,969,839 | B2 | 3/2015 | Vaschenko | |

(Continued)

OTHER PUBLICATIONS

Krivokorytov, et al.: "Stable droplet generator for brightness LPP EUV source"; Published in EUVL Workshop in 2013; pp. 1.

(Continued)

*Primary Examiner* — Phillip A Johnston
(74) *Attorney, Agent, or Firm* — McClure, Qualey & Rodack, LLP

(57) ABSTRACT

A method for generating high-brightness light sources is provided. The method includes introducing a gaseous material into the target material. The method further includes supplying the target material into a fuel target generator. The method also includes generating targets by forcing the target material with the gaseous material out of the fuel target generator. In addition, the method includes expanding the gaseous material in the targets to transform the targets to target mists. The method also includes focusing a main pulse laser on the target mists to generate plasma emitting high-brightness light.

20 Claims, 11 Drawing Sheets

(56) References Cited

U.S. PATENT DOCUMENTS

| | | |
|---|---|---|
| 9,093,530 B2 | 7/2015 | Lee et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,538,628 B1 | 1/2017 | Wu et al. |
| 9,548,303 B2 | 1/2017 | Lee et al. |
| 2009/0272919 A1* | 11/2009 | Abe .................. G03F 7/70033 250/504 R |
| 2015/0293456 A1 | 10/2015 | Dijksman et al. |
| 2016/0044772 A1 | 2/2016 | Graham |

OTHER PUBLICATIONS

Iakoubovskii, et al.: "Structure and pressure inside Xe nanoparticles embedded in Al"; Physical Review B 78, 064105 (2008); pp. 1-7.

Song, et al.: "Structure Change of Xe Precipitates Embedded in Al Studied by Analytical Transmission Electron Microscopy"; J. Published in Japan Inst. Metals. vol. 65, No. 5 in 2001 with English Abstract on the first page; pp. 1-6.

Novikov, et al.: "Calculation of Xe and Sn emission spectra in discharge devices: the influence of reabsorption in spectral lines"; Published in EUVL Symposium in 2006; pp. 1-16.

Michel, et al.: "A TEM study of bubbles growth with temperature in xenon and krypton implanted uranium dioxide"; Published in Defect and Diffusion Forum in 2012; pp. 1-7.

* cited by examiner

HIGH-BRIGHTNESS LIGHT SOURCE

PRIORITY CLAIM AND CROSS-REFERENCE

This application claims the benefit of U.S. Provisional Application No. 62/430,965, filed on Dec. 7, 2016, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses.

One type of EUV light source is laser-produced plasma (LPP). LPP technology produces EUV light by focusing a high-power laser beam onto small fuel droplet targets to form highly ionized plasma that emits EUV radiation with a peak of maximum emission at 13.5 nm. The EUV light is then collected by a collector and reflected by optics towards a lithography exposure object, e.g., a wafer.

Although existing methods and devices for generating EUV light have been adequate for their intended purposes, they have not been entirely satisfactory in all respects. Consequently, it would be desirable to provide a solution for increasing power conversion efficiency from the input energy for ionization.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
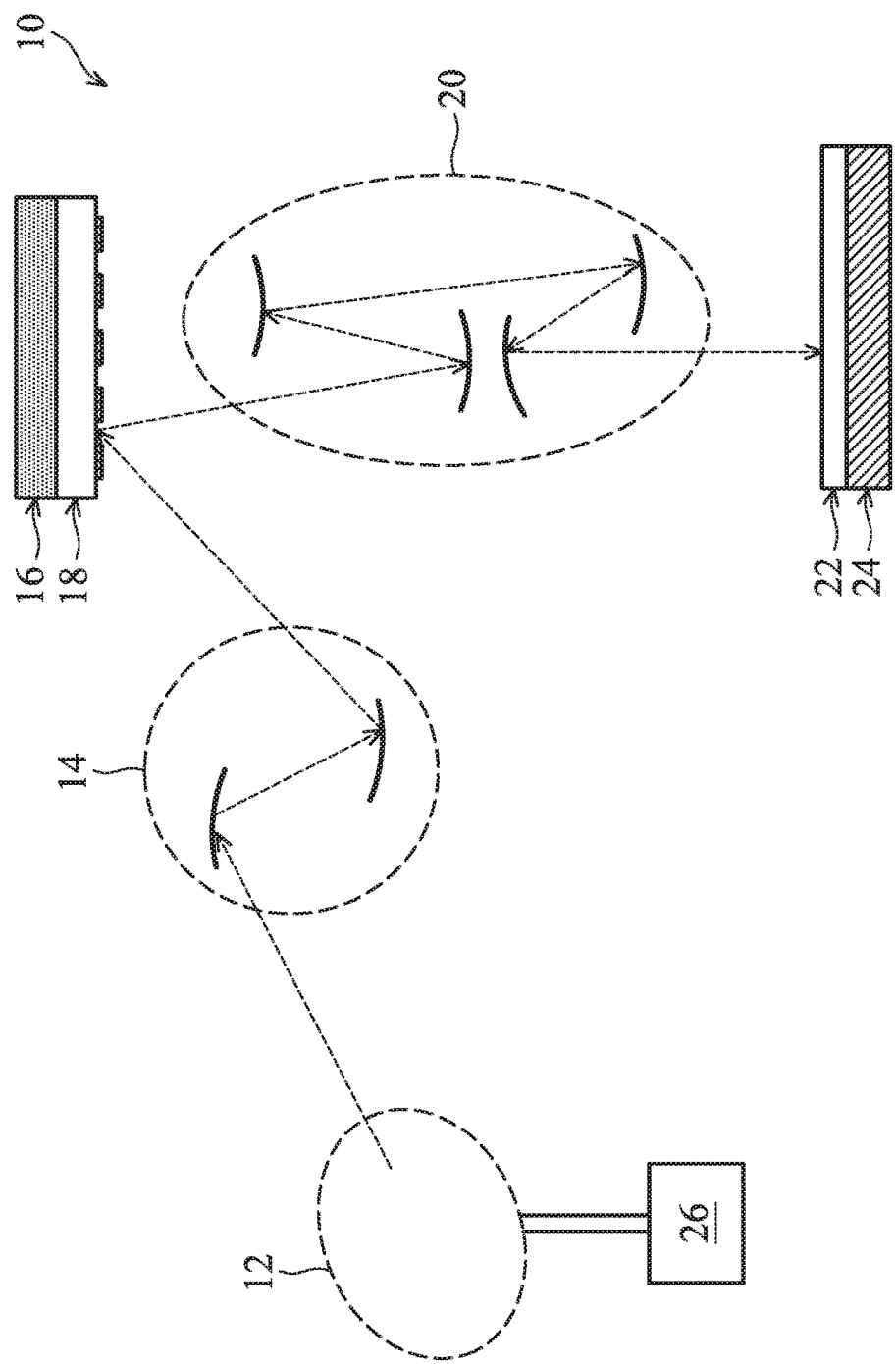
FIG. 1 shows a schematic view of a lithography system with a high-brightness light source, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic and diagrammatic view of a lithography system 10, in accordance with some embodiments. The lithography system 10 may also be generically referred to as a scanner that is operable to perform lithography exposing processes with respective radiation source and exposure mode.

The lithography system 10 includes a high-brightness light source 12, an illuminator 14, a mask stage 16, a mask 18, a projection optics module (or projection optics box (POB)) 20 and a substrate stage 24, in accordance with some embodiments. The elements of the lithography system 10 can be added to or omitted, and the invention should not be limited by the embodiment.

The high-brightness light source 12 is configured to generate radians having a wavelength ranging between about 1 nm and about 100 nm. In one particular example, the high-brightness light source 12 generates an EUV light with a wavelength centered at about 13.5 nm. Accordingly, the high-brightness light source 12 is also referred to as EUV light source. However, it should be appreciated that the high-brightness light source 12 should not be limited to emitting EUV light. The high-brightness light source 12 can be utilized to perform any high-intensity photon emission from excited target material.

In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the high-brightness light source 12 onto a mask stage 16, particularly to a mask 18 secured on the mask stage 16. In the present embodiment where the high-brightness light source 12 generates light in the EUV wavelength range, reflective optics is employed.

The mask stage 16 is configured to secure the mask 18. In some embodiments, the mask stage 16 includes an electrostatic chuck (e-chuck) to secure the mask 18. This is because the gas molecules absorb EUV light and the lithography system for the EUV lithography patterning is maintained in a vacuum environment to avoid EUV intensity loss. In the present disclosure, the terms mask, photomask, and reticle are used interchangeably.

In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The projection optics module (or projection optics box (POB)) 20 is configured for imaging the pattern of the mask 18 on to a semiconductor wafer 22 secured on a substrate stage 24 of the lithography system 10. In some embodiments, the POB 20 has refractive optics (such as for a UV lithography system) or alternatively reflective optics (such as for an EUV lithography system) in various embodiments. The light directed from the mask 18, carrying the image of the pattern defined on the mask, is collected by the POB 20. The illuminator 14 and the POB 20 are collectively referred to as an optical module of the lithography system 10.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the semiconductor wafer 22 is coated with a resist layer sensitive to the EUV light in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide hydrogen gas to the high-brightness light source 12. The hydrogen gas helps reduce contamination in the high-brightness light source 12.

Figure 2:
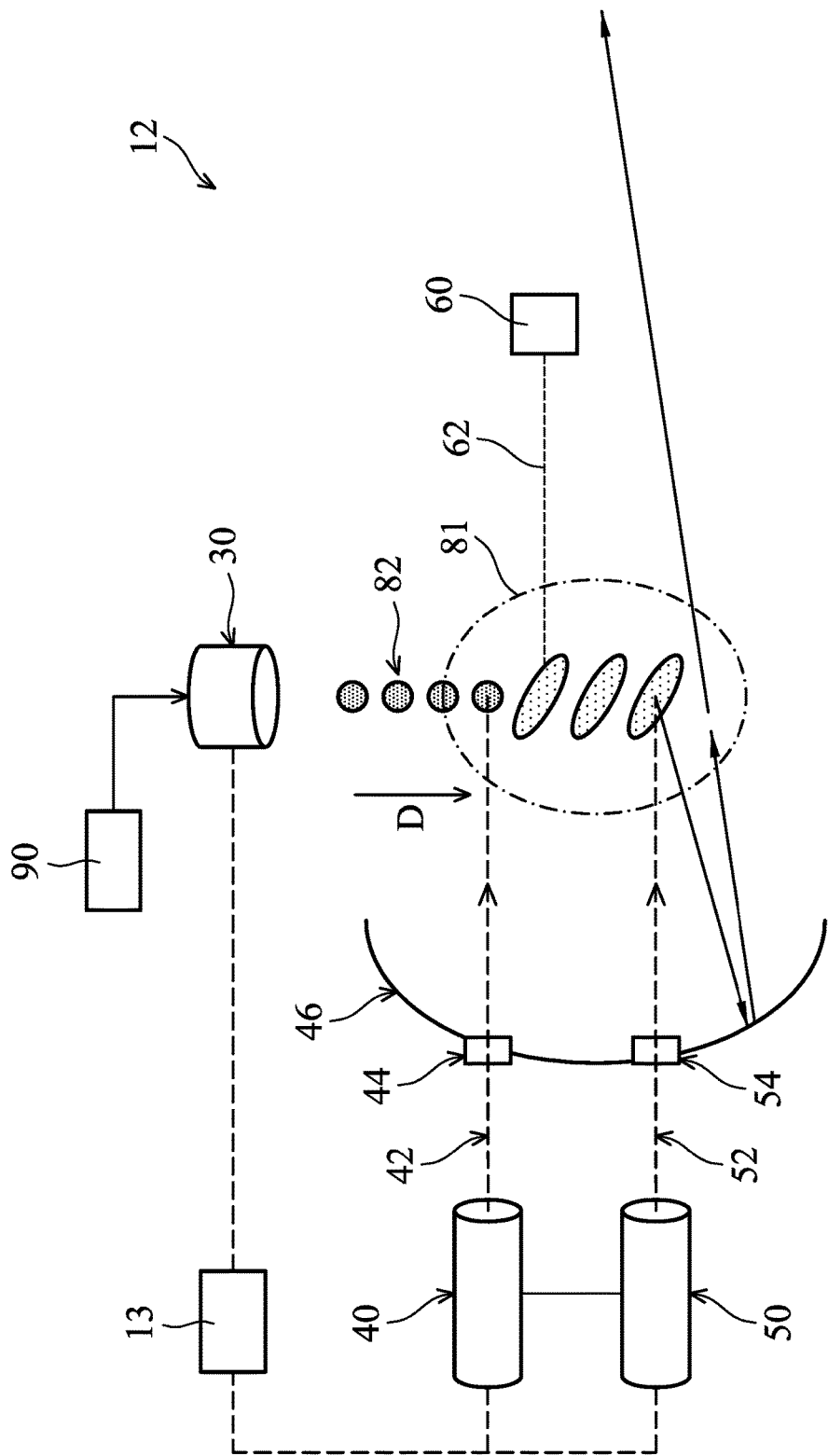
FIG. 2 is a diagrammatic view of the high-brightness light source in the lithography system of FIG. 1, in accordance with some embodiments.

FIG. 2 illustrates the high-brightness light source 12 in a diagrammatical view, in accordance with some embodiments. The high-brightness light source 12 employs a dual-pulse laser produced plasma (LPP) mechanism to generate plasma and further generate EUV light from the plasma.

In some embodiments, the high-brightness light source 12 includes a controller 13, a fuel target generator 30, a first laser source 40, a second laser source 50, and a laser produced plasma (LPP) collector 46. The above-mentioned elements of the high-brightness light source 12 may be held under vacuum. It is should be appreciated that the elements of the high-brightness light source 12 can be added to or omitted, and the invention should not be limited by the embodiment.

The fuel target generator 30 is configured to generate a plurality of targets 82. In an embodiment, the targets 82 are tin (Sn) droplets. In an embodiment, the targets 82 each have a diameter about 30 microns (μm). In an embodiment, the targets 82 are generated at a rate about 50 kilohertz (kHz) and are introduced into a zone of excitation 81 in the high-brightness light source 12 at a speed about 70 meters per second (m/s). Other material can also be used for the targets 82, for example, a tin containing liquid material such as eutectic alloy containing tin, lithium (Li), and xenon (Xe). The targets 82 may be in a solid or liquid phase.

The first laser source 40 is configured to produce a pre-pulse laser 42. The second laser source 50 is configured to produce a main pulse laser 52. In the present embodiment, the pre-pulse laser 42 has less intensity and a smaller spot size than the main pulse laser 52. The laser pulse 42 is used to heat (or pre-heat) the targets 82 to create a target mist of lower-density, which is subsequently irradiated by the main pulse laser 52, generating increased emission of EUV light.

In an embodiment, the first laser source 40 is a carbon dioxide ($CO_2$) laser source. In another embodiment, the first laser source 40 is a neodymium-doped yttrium aluminum garnet (Nd:YAG) laser source. In an embodiment, the second laser source 50 is a $CO_2$ laser source.

In various embodiments, the pre-pulse laser 42 has a spot size of about 100 μm or less, and the main pulse laser 52 has a spot size about 200-300 μm, such as 225 μm. The pre-pulse laser 42 and the main pulse laser 52 are generated to have certain driving powers to fulfill wafer volume production, such as a throughput of 125 wafers per hour.

For example, the pre-pulse laser 42 is equipped with about 2 kilowatts (kW) driving power, and the main pulse laser 52 is equipped with about 19 kW driving power. In various embodiments, the total driving power of the pre-pulse laser 42 and the main pulse laser 52, is at least 20 kW, such as 27 kW. However, it should be appreciated that many variations and modifications can be made to embodiments of the disclosure.

The pre-pulse laser 42 and main pulse laser 52 are directed through windows (or lenses) 44 and 54, respectively, into the zone of excitation 81. The windows 44 and 54 adopt a suitable material substantially transparent to the respective laser beams. The method for exciting the targets 82 supplied by the fuel target generator 30 is described later.

In an embodiment, a droplet catcher (not shown) is installed opposite the fuel target generator 30. The droplet catcher is used for catching excessive targets 82. For example, some targets 82 may be purposely missed by both of the pre-pulse lasers 42 and the main pulse lasers 52.

In some embodiments, the high-brightness light source 12 also includes a thermal device 60 for generating a thermal current 62 over the targets 82. As shown in FIG. 2, the thermal device 60 is positioned between the pre-pulse laser 42 and the main pulse laser 52 in a direction D of the trajectory of the targets 82. Namely, the thermal device 60 is arranged downstream of the pre-pulse laser 42. The thermal device 60 may be an IR heating tube.

The controller 13 is configured to control one or more elements of the high-brightness light source 12. In some embodiments, the controller 13 is configured to drive the fuel target generator 30 to generate the targets 82. In addition, the controller 13 is configured to drive the first laser source 40 and the second laser source 50 to fire the pre-pulse laser 42 and the main pulse laser 52. In some embodiments, the generation of the pre-pulse laser 42 and the main pulse laser 52 are controlled to be associated with the generation of targets 82 by the controller 13, so as make the pre-pulse laser 42 and the main pulse laser 52 hit each target 82 in sequence.

Figure 3:
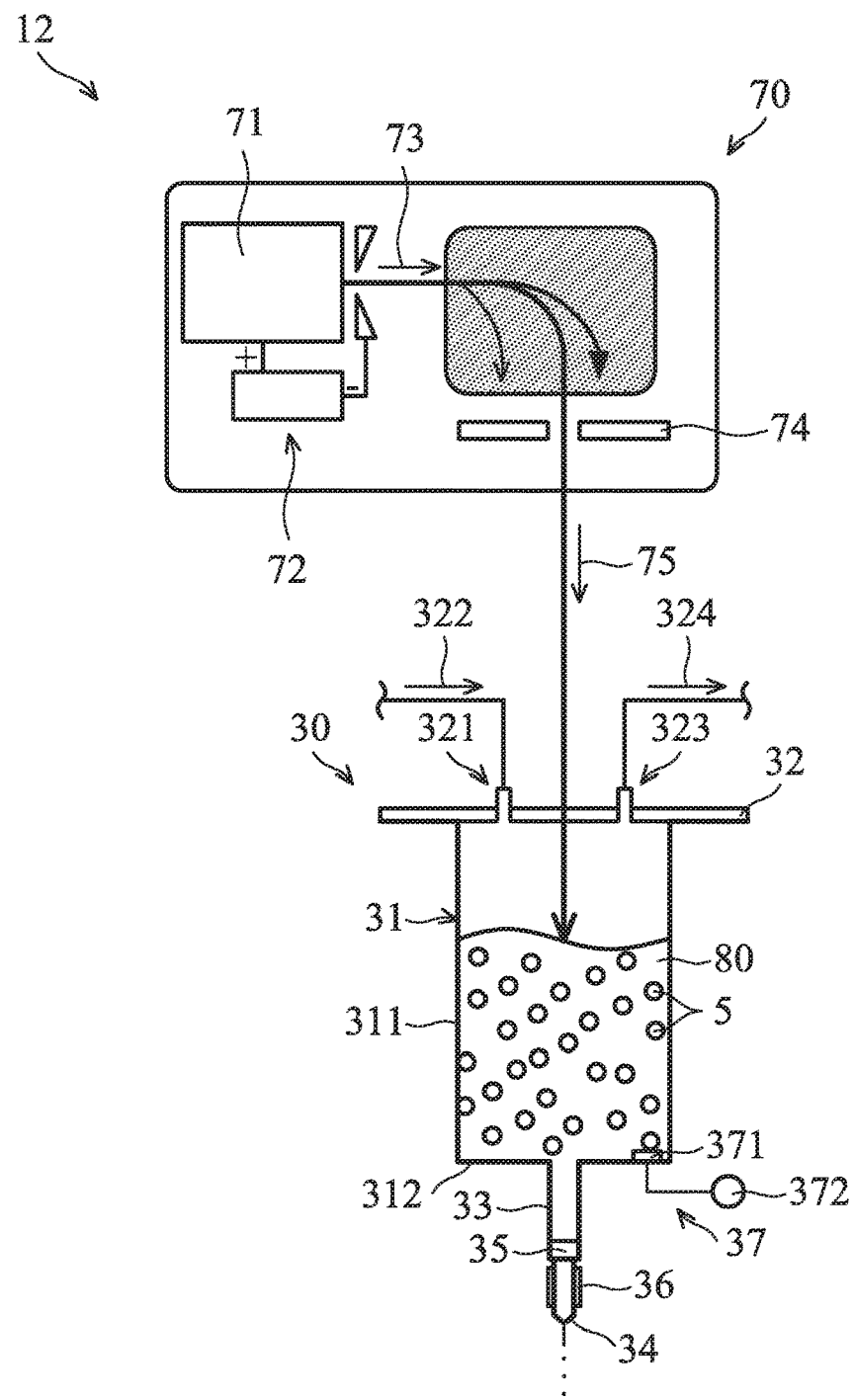
FIG. 3 shows a cross-sectional view of a fuel target generator connected to an ion beam implanter for implanting ions into target material contained in the fuel target generator, in accordance with some embodiments.

FIG. 3 shows a schematic view of the fuel target generator 30 connected to an ion beam generator 70, in accordance with some embodiments. In some embodiments, the fuel target generator 30 includes a reservoir 31, a cover 32, a hollow tube 33, a nozzle 34, a filter 35, a piezoelectric actuator 36 and a charging circuit 37. The elements of the fuel target generator 30 can be added to or omitted, and the invention should not be limited by the embodiment.

The reservoir 31 is configured for holding the target material 80. The reservoir 31 may include a sidewall 311 and a bottom wall 312. The sidewall 311 surrounds the outer edge of the bottom wall 312 and extends away from the bottom wall 312.

The cover 32 is connected to the upper end of the sidewall 311. The cover 32 may be removable from the reservoir 31. In some embodiments, one gas inlet 321 and one gas exhaust 323 are formed on the cover 32. The gas inlet 321 is connected to a gas line for introducing pumping gas 322, such as argon, into the reservoir 31. The gas exhaust 323 is connected to a gas line and a pump (not shown) for pumping out the gas 324 in the reservoir 31.

By controlling the gas flow in the gas lines connected to the gas inlet 321 and the gas exhaust 323, the pressure in the reservoir 31 can be manipulated. For example, when gas 322 is continuously supplied into the reservoir 31 via the gas inlet 321 and when the gas exhaust 323 is blocked and not exhausting gas, the pressure in the reservoir 31 increases. As a result, the target material 80 in the reservoir 31 can be forced out of the reservoir 31.

The hollow tube 33 and the nozzle 34 define an orifice through which the target material 80 escapes to form the targets 82 of the target material 80. The output of the targets 82 can be controlled by an actuator such as a piezoelectric actuator 36. The filter 35 may be placed in the path of the flow, such as the tube 33, of the target material 80 to remove impurities such as the non-target particles from the target material 80.

The charging circuit 37 is configured for charging ions into the fuel target generator 30. The charging circuit 37 may include an electrode 371 positioned at the bottom wall of the reservoir 31. The electrode 371 is connected to ground or connected to a power supply 372.

However, it should be appreciated that many variations and modifications can be made to embodiments of the disclosure. In some other embodiments, the electrode 371 is omitted, the bottom wall 312 and/or the sidewall 311 of the reservoir 31 is made of conductive material and is electrically connected to ground or connected to the power supply 372.

In some embodiments, as shown in FIG. 3, the high-brightness light source 12 also includes an ion beam generator 70. The ion beam generator 70 is configured for implanting ions into the target material 80 contained in the reservoir 31 so as to generate the gaseous material 5 in the target material 80.

In some embodiments, the ion beam generator 70 includes an ion source 71, a high voltage power supply 72, and a mass analyzer 74. The ion source 71 is coupled to the high voltage power supply 72 to ionize dopant element (e.g., dopant gas element), thereby forming an ion beam 73. The mass analyzer 74 is positioned downstream of the ion source 71 to analyze the ions in the ion beam 73.

As a result, an ion beam 75 having ions with an appropriate charge-to-mass ratio is allowed to pass through the resolving aperture of the mass analyzer 74 and then implanted into the target material 80 contained in the reservoir 31. In some embodiments, the ions implanted into the target material 80 are interacting with the ions from the charging circuit 37 so as to generate the gaseous material 5 in the target material 80.

It should be noted that the configuration of mean for supplying the gaseous material 5 into the target material 80 should not be limited to the above embodiments and may vary depending on intended use or design parameters. Some exemplary embodiments are provided below.

Figure 4:
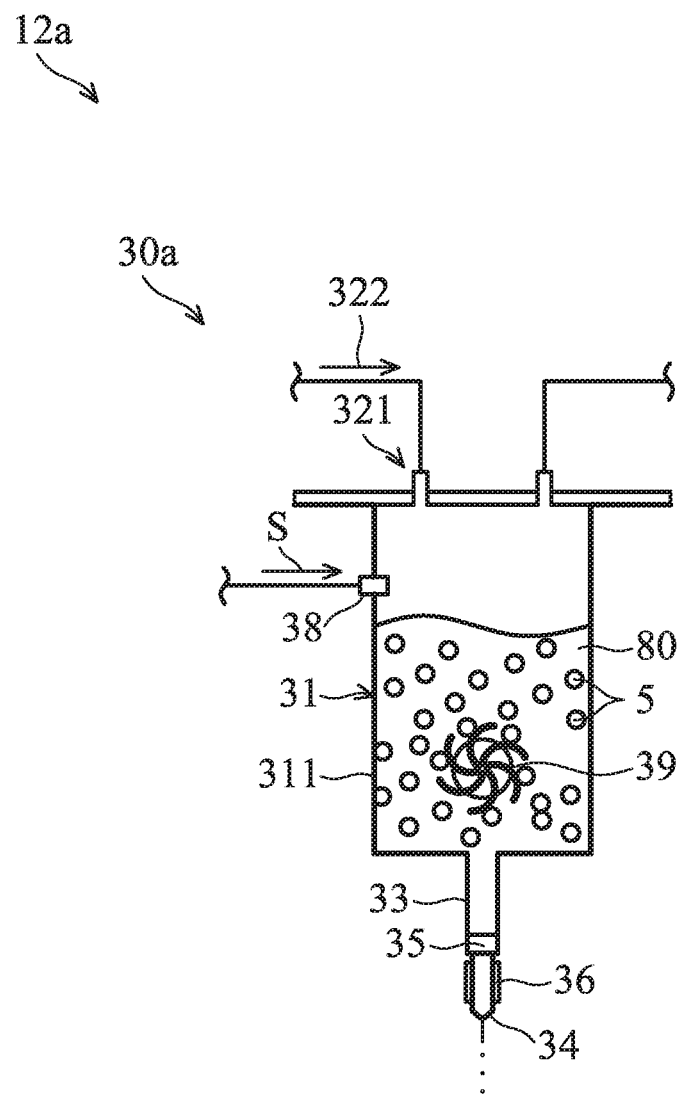
FIG. 4 shows a cross-sectional view of a fuel target generator in accordance with some embodiments.

FIG. 4 shows a cross-sectional view of a fuel target generator 30a in accordance with some embodiments. In the embodiments of FIG. 4, elements that are similar to those of the embodiments of FIG. 3 are provided with the same reference numbers, and the features thereof are not repeated in the interest of brevity.

The differences between the fuel target generator 30a and the fuel target generator 30 include the fuel target generator 30 further including an inlet 38 and a blending member 39. The inlet 38 is configured for the delivery of substance S into the interior of the reservoir 31. The inlet 38 may be connected to the sidewall 311 of the reservoir 31. Alternatively, the inlet 38 may be connected to the cover 32 where the gas inlet 321 is connected.

In some embodiments, the inlet 38 is connected to a gas line. The substance S supplied from the gas line includes gas. The gas supplied from the inlet 38 is different from the pumping gas 322 from the gas inlet 321. One example of the gas from the inlet 38 may include a gas element such as helium, neon, argon or a combination thereof. Alternatively, the gas from the inlet 38 may include a gas molecule such as nitrogen. Alternatively, the gas from the inlet 38 may include a gas compound such as stannane ($SnH_4$) and Xenon hexafluoride ($XeF_6$).

In some other embodiments, the inlet 38 is connected to a tube which supplies substance S in a solid or liquid phase. The solid or liquid substance S supplied from the inlet 38 may include Xenon hexafluoride ($XeF_6$) or Xenon tetrafluoride ($XeF_4$). In some other embodiments, the inlet 38 is omitted. The substance S in a solid or liquid phase is introduced to the fuel target generator 30a via the upper opening of the reservoir 31.

In some embodiments, the fuel target generator 30a also include a blending member 39 for facilitating the mixing of the substances S and the target material 80 so as to introduce the gaseous material 5 as the target material 80. The blending member 39 may include a rotor blade disposed in the reservoir 31. However, it should be appreciated that many variations and modifications can be made to embodiments of the disclosure.

Figure 5:
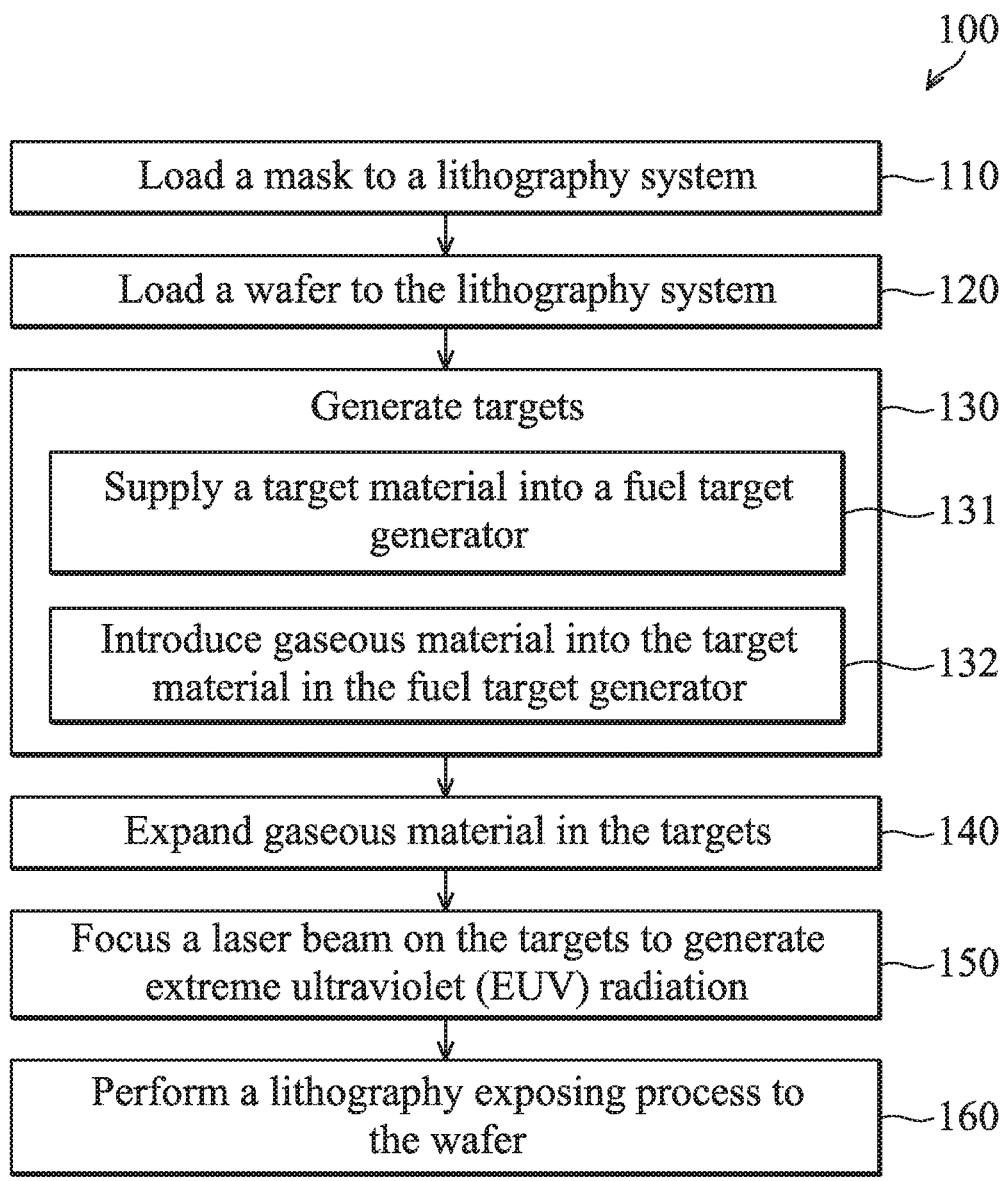
FIG. 5 is a flowchart of a method for a lithography process, in accordance with some embodiments.

FIG. 5 is a flowchart of a method 100 for an EUV lithography process, in accordance with some embodiments. For illustration, the flow chart will be described along with the drawings shown in FIGS. 1-4, which show schematic views of the lithography system 10. Some of the described transportation stages can be replaced or eliminated in different embodiments. Additional features can be added to the semiconductor device structure. Some of the features described below can be replaced or eliminated in different embodiments.

The method 100 begins with operation 110, in which an EUV mask, such as mask 18, is loaded to the lithography system 10 that is operable to perform an EUV lithography exposing process. The mask 18 may include an IC pattern to be transferred to a semiconductor substrate, such as the semiconductor wafer 22. The operation 110 may further include various steps, such as securing the mask 18 on the mask stage 16 and performing an alignment.

The method 100 continues with operation 120, in which the semiconductor wafer 22 is loaded to the lithography system 10. The semiconductor wafer 22 is coated with a resist layer. In the present embodiment, the resist layer is sensitive to the EUV radiation from the high-brightness light source 12 of the lithography system 10.

The method 100 continues with operation 130 in which targets 82 are generated by forcing the target material 80 with the gaseous material 5 out of the fuel target generator 30 or the fuel target generator 30a. In some embodiments, the fuel target generator 30 shown in FIG. 3 or the fuel target generator 30a shown in FIG. 4 is configured to generate the targets 82. The fuel target generator 30 or the fuel target generator 30a is controlled to generate targets 82 with the proper material, proper size, proper rate, and proper movement speed and direction.

In some embodiments, the targets 82 generated by the fuel target generator 30 or the fuel target generator 30a contain the gaseous material 5 to optimize the energy conversion efficiency. Operations 131 and 132 of a process for preparing gas-containing targets 82 are described below, in accordance with some embodiments, are described below.

In operation 131, the target material 80 is supplied into the fuel target generator 30 or the fuel target generator 30a. The target material 80 may be supplied by a storage tank (not shown). The target material 80 may include tin or a tin containing liquid material such as eutectic alloy containing tin, lithium (Li), and xenon (Xe).

In operation 132, the gaseous material 5 is introduced into the target material 80 in the fuel target generator 30 or the fuel target generator 30a.

In some embodiments, the gaseous material 5 is introduced into the target material 80 contained in the fuel target generator 30 by the use of the ion beam generator 70. The ion beam generator 70 generates an ion beam 75 having ions of dopant gas substance and projects the ion beam 75 to the target material 80 contained in the fuel target generator 30. Afterwards, the ions of dopant gas substance interact with opposite ions from the charging circuit 37 to transform the gaseous material 5. The ions of dopant gas substance may include ions of a gas element, such as helium, argon, or neon. Alternatively, the ions of dopant gas substance may include a gas molecule, such as hydrogen, inert gases, for example helium, argon, or neon, or their compound.

In some embodiments, the gaseous material 5 is introduced into the target material 80 contained in the fuel target generator 30a by the use of the blending member 39. A gas and/or substance S which is able to be transferred to gas is introduced into the fuel target generator 30a via the inlet 38. Afterwards, the blending member 39 mixes the gas and/or substance in the fuel target generator 30a into the target material 80 so as to form the gaseous material 5. The introduced gas may include a noble gas, such as helium, argon, neon, xeon or a combination thereof. Alternatively, the introduced gas may include a gas molecule, such as nitrogen or hydrogen. Alternatively, the introduced gas may include a gas compound, such as stannane.

In some embodiments, the gas blended into the target material 80 is decomposed due to the high temperature. In this case, the gaseous material 5 may include the gaseous phase product of the decomposition. For example, stannane is decomposed in the molten metal to produce hydrogen (i.e. gaseous phase product) and tin. Therefore, after stannane is blended into the target material 80 at a high temperature (e.g., 250 degree centigrade), stannane is decomposed in the target material 80, and the gaseous material 5 in the target material 80 includes hydrogen and stannane if stannane is not completely consumed.

In some embodiments, the pumping gas 322 configured for forcing the target material 80 to form target mists is blended into the target material 80 as well. As a result, the gaseous material 5 includes the pumping gas 322. In some embodiments, no gas is supplied into the reservoir via the inlet 38. The gaseous material 5 is composed of the pumping gas 322.

The method 100 continues with operation 140 in which the gaseous material 5 in the targets 82 is expanded. In some embodiments, the first laser source 40 is used to generate the pre-pulse laser 42 to expand the gaseous material 5 in the targets 82 before the main pulse laser 52 irradiates the targets 82.

Figure 6:
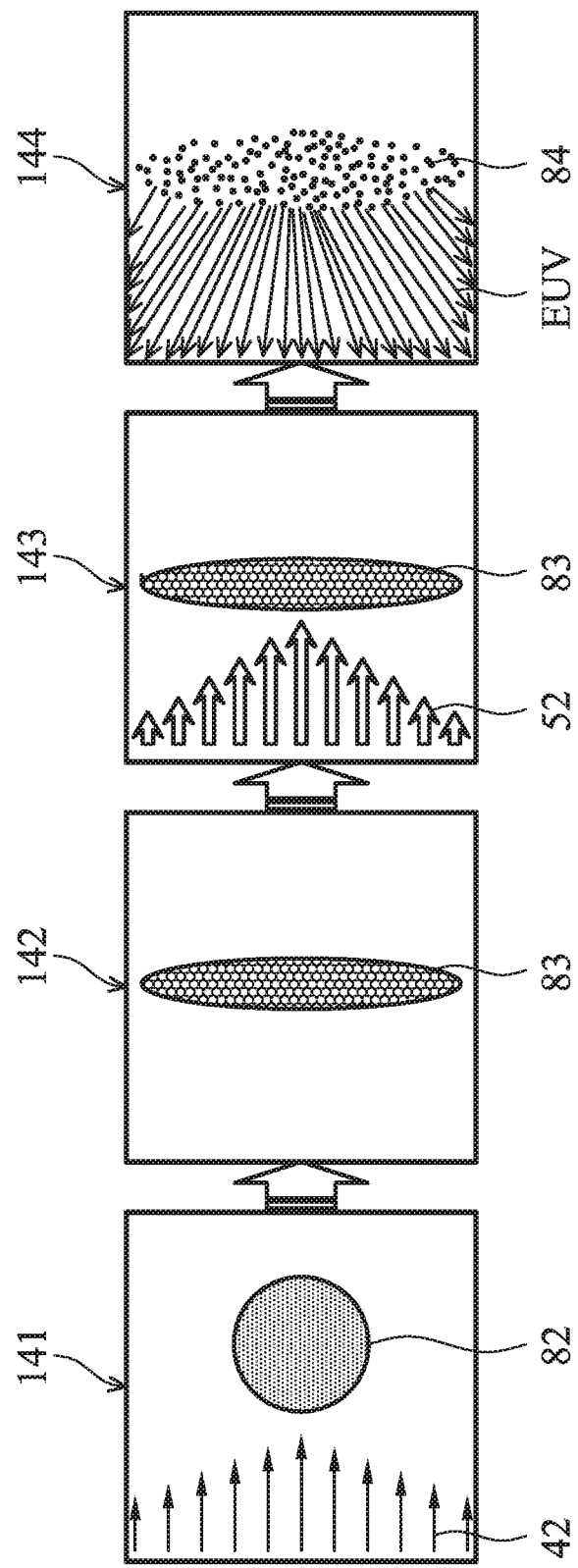
FIG. 6 shows a schematic view of multiple stages of a method for generating high-brightness light by consecutively irradiating a pre-pulse laser and a main pulse laser over a gas-containing target, in accordance with some embodiments.

Specifically, as shown in plot 141 of FIG. 6, before being irradiated by the pre-pulse laser 42, the targets 82 have circular shape. Afterwards, when the targets 82 are irradiated by the pre-pulse laser 42, a portion of the pre-pulse laser 42 is converted to kinetic energy to transform the targets 82 to pancake-shaped target mists 83, as shown in plot 142 of FIG. 6. In the meantime, a portion of the energy of the pre-pulse laser 42 is converted to heat and causes expansion of the gaseous material 5 in the targets 82. Therefore, the target mists 83 have a lower density than that of the targets 82.

In some embodiments, the first laser source 40 is configured to generate the pre-pulse laser 42 synchronously with the generation of the targets 82. However, the pre-pulse laser 42 can be controlled to be delayed or advanced in time so that they will heat the respective targets 82 at different excitation positions.

The method 100 continues with operation 150 in which the main pulse laser 52 is focused on the target mists 83 to generate EUV radiation. In some embodiments, the second laser source 50 is used to generate the main pulse laser 52 to excite the target material 80 in the targets 82. Specifically, the main pulse laser 52 heats the target material 80 in the targets 82 to a critical temperature. At the critical temperature, the target material 80 in the targets 82 shed their electrons and become a plasma 84 comprising ions.

It should be noted that since the target mists 83 has a lower density than the target mists used in the conventional method (i.e., with no gaseous material expanded therein), most of the target material 80 in the target mists 83 would be irradiated by the main-pulse laser 52.

As a result, as shown in plot 143 of FIG. 6, even the target material 80 located at the rear side (i.e., the side opposite to the side where the main-pulse laser 52 is projected) of the target mists 83 can be sufficiently irradiated by the main-pulse laser 52. Therefore, as shown in plot 144, almost all of the material in the target mists 83 is excited to plasma 84 and emits EUV light.

In addition, since almost all of the material in the target mists 83 is excited to plasma 84, contamination of the collector 46 may be prevented or mitigated because the deposition of material of the target mists 83 which is not converted to plasma 84 on the collector 46 is reduced.

The method 100 continues with operation 160 in which a lithography exposing process is performed on the semiconductor wafer 22 in the lithography system 10. In operation 160, the EUV radiation generated by the high-brightness light source 12 or the high-brightness light source 12a is illuminated on the mask 18 (by the illuminator 14), and is further projected on the resist layer coated on the semiconductor wafer 22 (by the POB 20), thereby forming a latent image on the resist layer. In some embodiments, the lithography exposing process is implemented in a scan mode.

Figure 7:
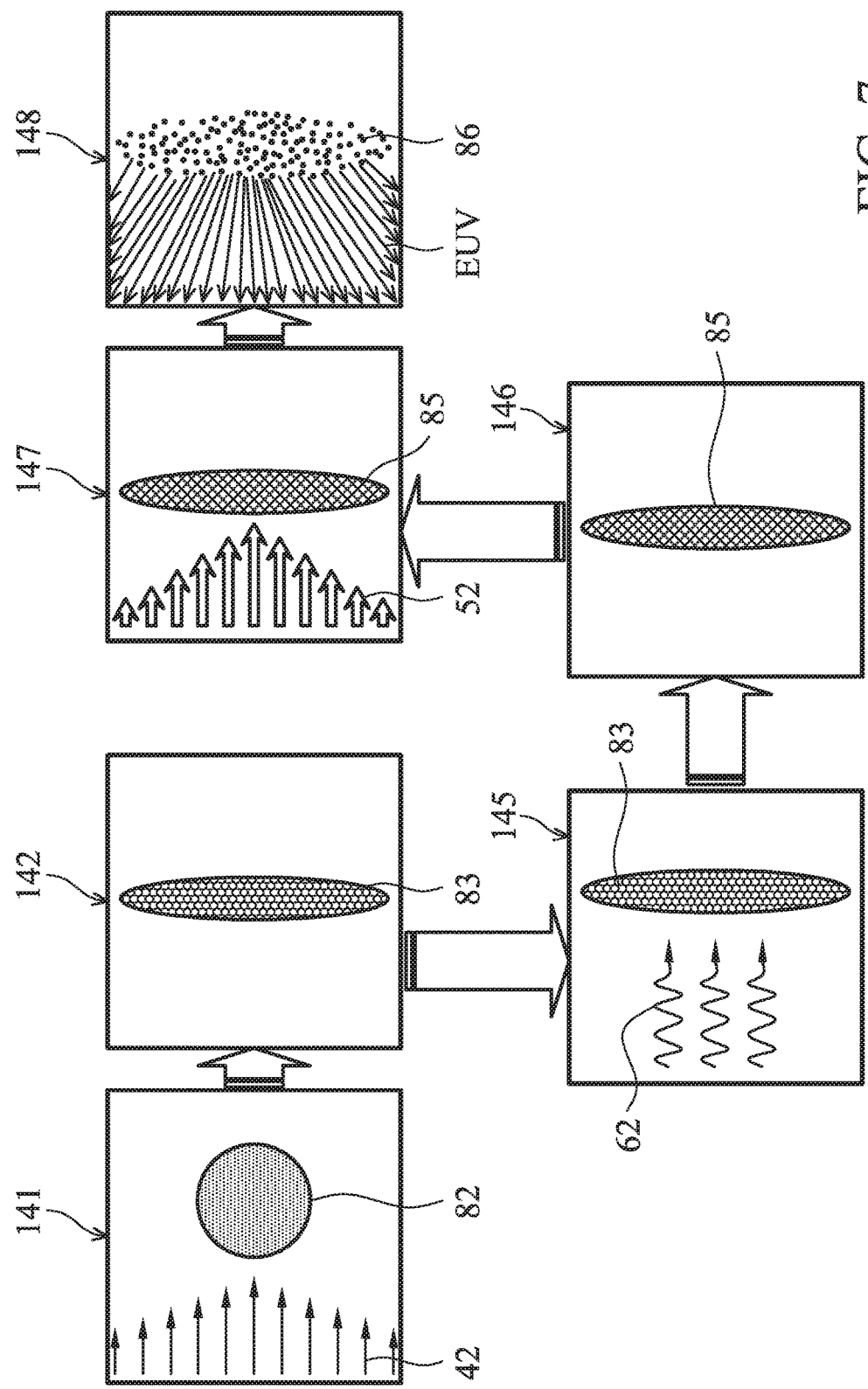
FIG. 7 shows a schematic view of multiple stages of a method for generating high-brightness light by consecutively irradiating a pre-pulse laser, a thermal current and a main pulse laser over a gas-containing target, in accordance with some embodiments.

In some embodiments, the expansion of the target mists 83 is further induced thermally by projecting a thermal current over the target mists before it is excited. For example, as shown in plot 145 of FIG. 7, the target mists 83 which have been irradiated by the pre-pulse laser 42 are projected by a thermal current 62. The thermal current 62 causes further expansion of the gaseous material 5 in the target mists 83 and transforms the target mists 83 to the target mists 85 (plot 146).

Since the target mists 85 have a lower density than the target mists 83, more target material 80 in the target mists 85 is excited to plasma 86 (plots 148) when the main pulse laser 52 irradiates the target mists 85 (plot 147). Therefore, a higher energy conversion efficiency can be realized, and contamination of the collector 46 can be prevented.

The method 100 may include other operations to complete the lithography process. For example, the method 100 may include an operation by developing the exposed resist layer to form a resist pattern having a plurality of openings defined thereon. Particularly, after the lithography exposing process at the operation 160, the semiconductor wafer 22 is transferred out of the lithography system 10 to a developing unit to perform a developing process to the resist layer. The method 100 may further include other operations, such as various baking steps. As one example, the method 100 may include a post-exposure baking (PEB) step between the operation 160 and the developing process.

The method 100 may further include other operations, such as an operation to perform a fabrication process to the semiconductor wafer 22 through the openings of the resist pattern. In one example, the fabrication process includes an etch process to the semiconductor wafer 22 using the resist pattern as an etch mask. In another example, the fabrication process includes an ion implantation process to the semiconductor wafer 22 using the resist pattern as an implantation mask.

Figure 8:
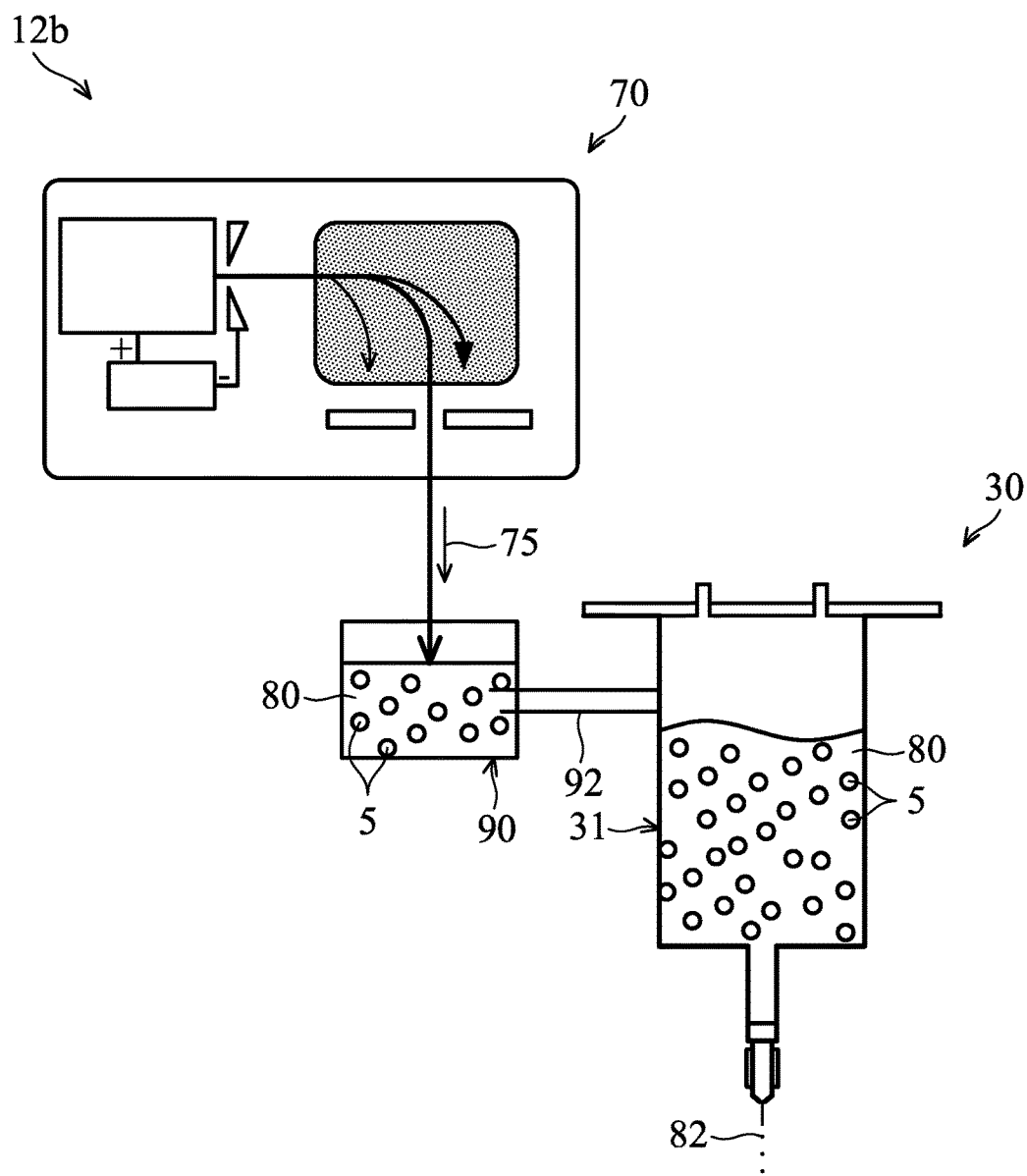
FIG. 8 shows a cross-sectional view of a fuel target generator connected to a storage tank, in accordance with some embodiments.

FIG. 8 shows a cross-sectional view of partial elements of a high-brightness light source 12b, in accordance with some embodiments. In the embodiments of FIG. 8, elements that are similar to those of the embodiments of FIG. 1-3 are provided with the same reference numbers, and the features thereof are not repeated in the interest of brevity.

The differences between the high-brightness light source 12b and the high-brightness light source 12 include the high-brightness light source 12b supplying the gaseous material 5 into the target material 80 outside the fuel target generator 30, and the target material 80 which has embedded with the gaseous material 5 is then delivered to the fuel target generator 30.

In some embodiments, the high-brightness light source 12b includes a storage tank 90. The storage tank 90 is configured to contain the target material 80. The target material 80 is supplied to the fuel target generator 30 via a line 92. A pump or a valve (not shown in FIG. 8) may be connected to the line 92 to control the flow of the target material 80.

The ion beam generator 70 is connected to the storage tank 90. The ion beam generator 70 generates an ion beam 75 having ions of dopant gas substance and projects the ion beam 75 into the target material 80 contained in the storage tank 90. The storage tank 90 may further include a charging circuit similar to the charging circuit 37 shown in FIG. 3 to provide ions of opposite charges.

Figure 9:
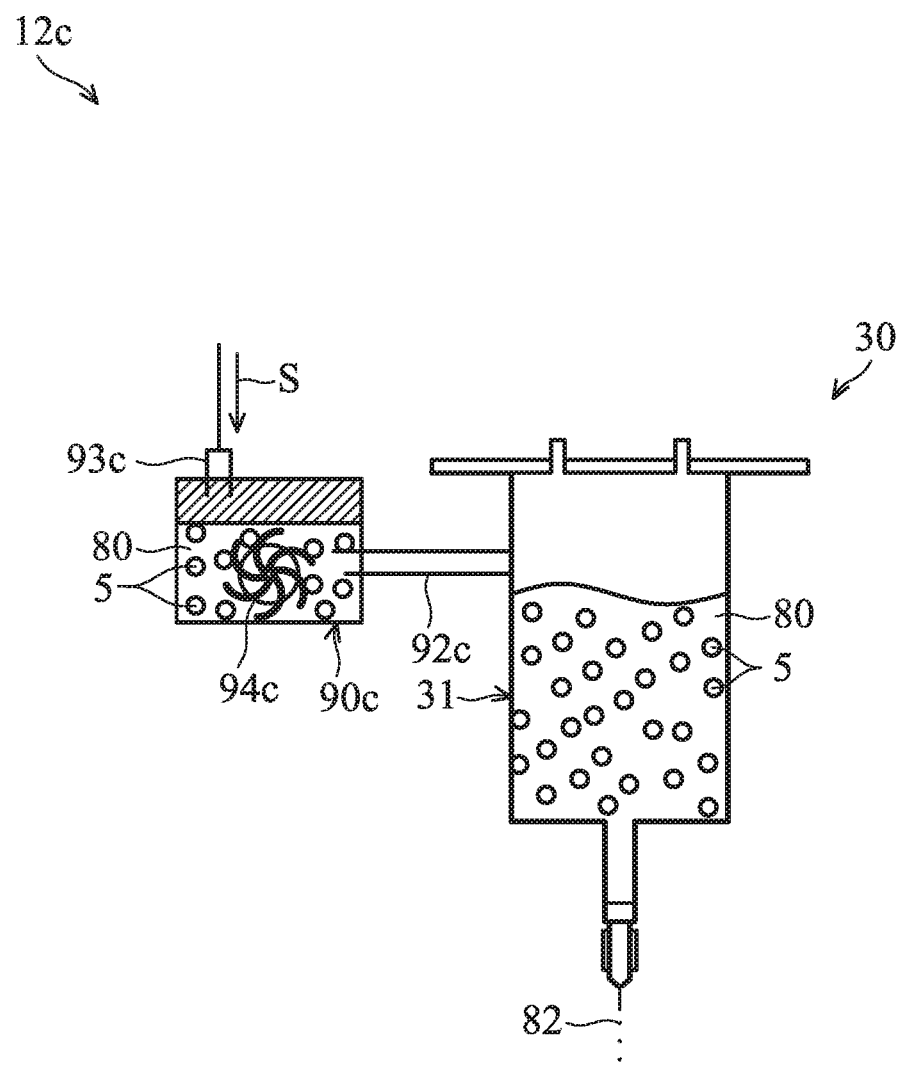
FIG. 9 shows a cross-sectional view of a fuel target generator connected to a storage tank, in accordance with some embodiments.

FIG. 9 shows a cross-sectional view of partial elements of a high-brightness light source 12c, in accordance with some embodiments. In the embodiments of FIG. 9, elements that are similar to those of the embodiments of FIG. 1-3 are provided with the same reference numbers, and the features thereof are not repeated in the interest of brevity.

The differences between the high-brightness light source 12c and the high-brightness light source 12 include the high-brightness light source 12c supplying the gaseous material 5 into the target material 80 outside the fuel target generator 30, and the target material 80 which has embedded with the gaseous material 5 is then delivered to the fuel target generator 30.

In some embodiments, the high-brightness light source 12c includes a storage tank 90c. The storage tank 90c is configured to contain the target material 80. The target material 80 is supplied to the fuel target generator 30 via a line 92c. A pump or a valve (not shown in FIG. 8) may be connected to the line 92c to control the flow of the target material 80.

The storage tank 90c also includes an inlet 93c and a blending means 94c. The inlet 93c is configured for the delivery of a gas and/or substance S which is able to be transferred into a gas into the storage tank 90d. The blending means 94c is configured for facilitating the mixing of the substances S and the target material 80. The blending means 94d may include a rotor blade disposed in the storage tank 90d.

Figure 10:
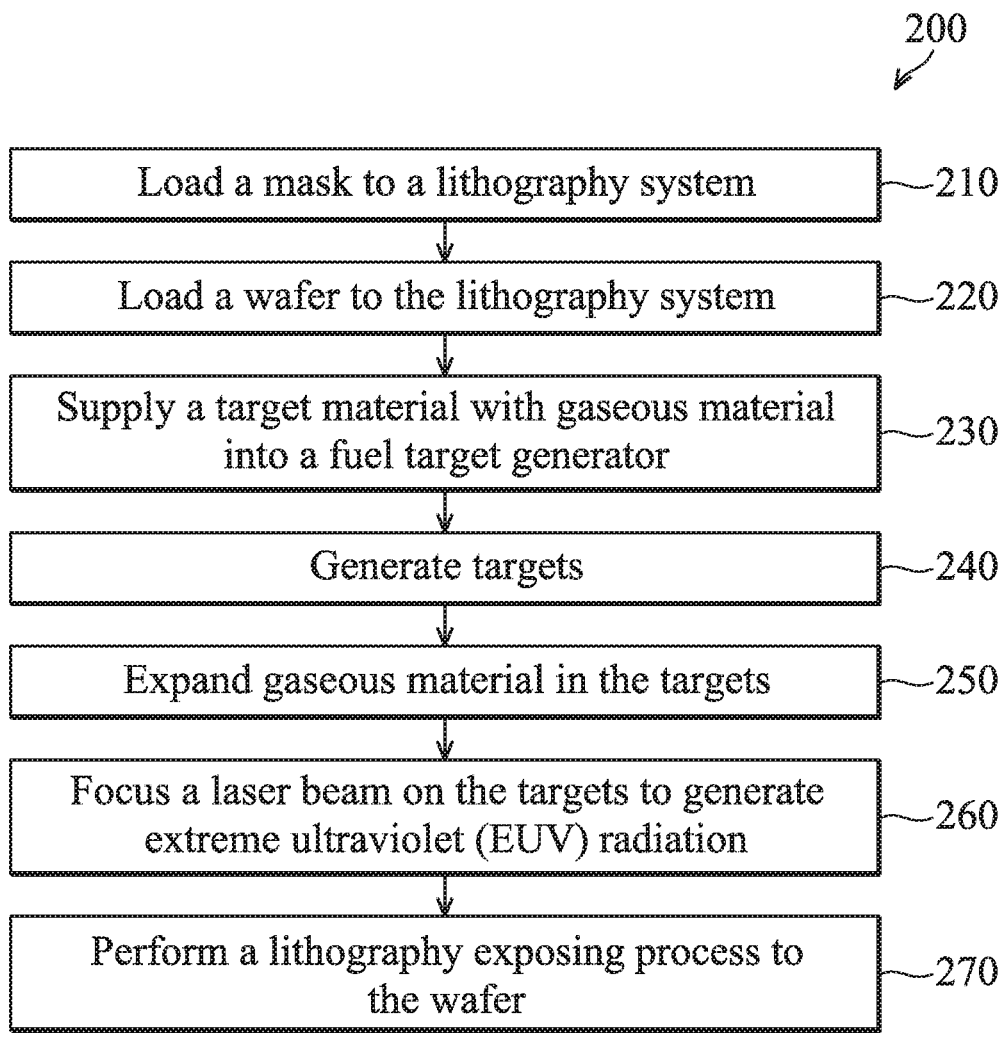
FIG. 10 is a flowchart of a method for a lithography process, in accordance with some embodiments.

FIG. 10 is a flowchart of a method 200 for an EUV lithography process, in accordance with some embodiments. For illustration, the flow chart will be described along with the drawings shown in FIGS. 1-2 and 9-10, which show schematic views of the lithography system 10. Some of the described transportation stages can be replaced or eliminated in different embodiments. Additional features can be added to the semiconductor device structure. Some of the features described below can be replaced or eliminated in different embodiments.

The method 200 begins with operation 210, in which an EUV mask, such as mask 18, is loaded to the lithography system 10 that is operable to perform an EUV lithography exposing process. The mask 18 may include an IC pattern to be transferred to a semiconductor substrate, such as the semiconductor wafer 22. The operation 210 may further include various steps, such as securing the mask 18 on the mask stage 16 and performing an alignment.

The method 200 continues with operation 220, in which the semiconductor wafer 22 is loaded to the lithography system 10. The semiconductor wafer 22 is coated with a resist layer. In the present embodiment, the resist layer is sensitive to the EUV radiation from the high-brightness light source 12 of the lithography system 10.

The method 200 continues with operation 230 in which the target material 80 with the gaseous material 5 is supplied into the fuel target generator 30.

In some embodiments, the target material 80 with the gaseous material 5 is supplied by the storage tank 90 shown in FIG. 8. To prepare gas contained target material 80, the ion beam generator 70 generates an ion beam 75 having ions of dopant gas substance into the target material 80 contained in the storage tank 90. Afterwards, the ions of dopant gas substance interact with opposite ions from the charging circuit 37 to transform the gaseous material 5. The ions of dopant gas substance may include ions of a gas element, such as helium, argon, or neon. Alternatively, the ions of dopant gas substance may include a gas molecule, such as hydrogen, inert gases, for example helium, argon, or neon, or their compound.

In some embodiments, the target material 80 with the gaseous material 5 is supplied by the storage tank 90c shown in FIG. 9. A gas and/or substance S which is able to be transferred into a gas is introduced into the storage tank 90b via the inlet 93c. Afterwards, the blending means 94c mixes the gas and/or substance in the storage tank 90b into the target material 80 so as to form the gaseous material 5. The introduced gas may include a noble gas, such as helium, argon, neon, xeon or a combination thereof. Alternatively, the introduced gas may include a gas molecule, such as nitrogen or hydrogen. Alternatively, the introduced gas may include a gas compound, such as stannane.

The method 200 continues with operation 240 in which targets 82 are generated. In some embodiments, the fuel target generator 30 shown in FIG. 8 or 9 is configured to generate the targets 82. The fuel target generator 30 is controlled to generate targets 82 of the proper material, proper size, proper rate, and proper movement speed and direction.

The method 200 continues with operation 250 in which the gaseous material 5 in the targets 82 is expanded. In some embodiments, the first laser source 40 is used to generate the pre-pulse laser 42 to expand the gaseous material 5 in the targets 82 before the main pulse laser 52 irradiates the targets 82. In some embodiments, the expansion of the targets 82 is induced thermally by projecting a thermal current over the targets before it is excited.

The method 200 continues with operation 260 in which the main pulse laser 52 is focused on the targets 82 to generate EUV radiation. In some embodiments, the second laser source 50 is used to generate the main pulse laser 52 to excite the target material 80 in the targets 82. The second laser source 50 may be synchronized with the first laser source 40.

The method 200 continues with operation 260 in which a lithography exposing process is performed on the semiconductor wafer 22 in the lithography system 10. In operation 260, the EUV radiation generated by the high-brightness light source 12b or the high-brightness light source 12c is illuminated on the mask 18 (by the illuminator 14), and is further projected on the resist layer coated on the semiconductor wafer 22 (by the POB 20), thereby forming a latent image on the resist layer. In some embodiments, the lithography exposing process is implemented in a scan mode.

The method 200 may include other operations to complete the lithography process. For example, the method 200 may include an operation by developing the exposed resist layer to form a resist pattern having a plurality of openings defined thereon. Particularly, after the lithography exposing process at the operation 260, the semiconductor wafer 22 is transferred out of the lithography system 10 to a developing unit to perform a developing process to the resist layer. The method 200 may further include other operations, such as various baking steps. As one example, the method 200 may include a post-exposure baking (PEB) step between the operation 260 and the developing process.

The method 200 may further include other operations, such as an operation to perform a fabrication process to the semiconductor wafer 22 through the openings of the resist pattern. In one example, the fabrication process includes an etch process to the semiconductor wafer 22 using the resist pattern as an etch mask. In another example, the fabrication process includes an ion implantation process to the semiconductor wafer 22 using the resist pattern as an implantation mask.

Figure 11:
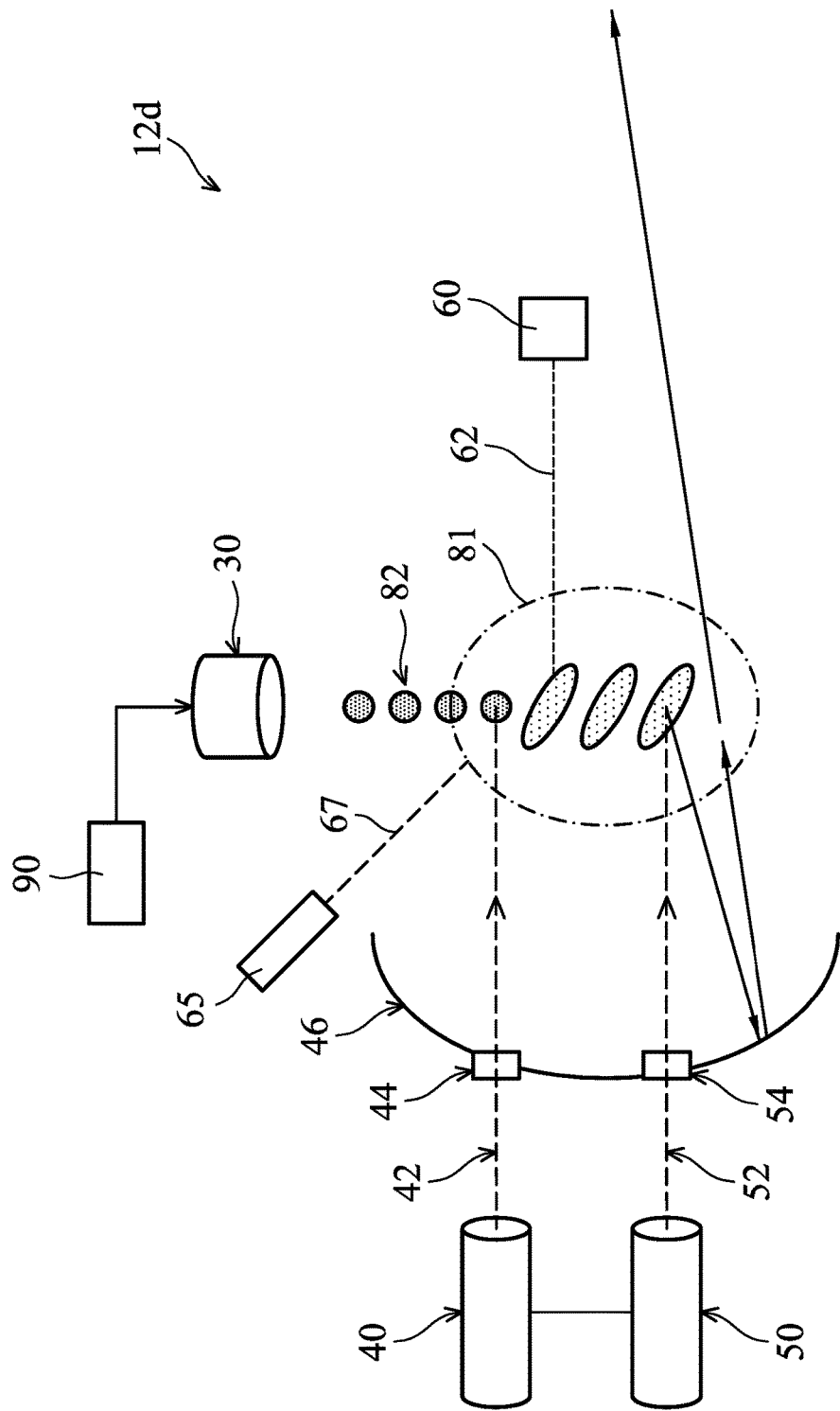
FIG. 11 is a diagrammatic view of a high-brightness light source, in accordance with some embodiments.

FIG. 11 is a diagrammatic view of a high-brightness light source 12d, in accordance with some embodiments. In the embodiments of FIG. 11, elements that are similar to those of the embodiments of FIG. 2 are provided with the same reference numbers, and the features thereof are not repeated in the interest of brevity. The differences between the high-brightness light source 12d and the high-brightness light source 12 include the high-brightness light source 12d further including an ion species injector 65.

The ion species injector 65 is configured to generate a beam of charged ion species 67. In some embodiments, the ion species injector 65 may comprise one or more electron guns, respectively configured to generate a beam of electrons 67. In some embodiments, the electron gun may operate to generate electrons at a frequency of approximately 50,000 electrons or more per second. In other embodiments, the electron gun may operate to generate electrons at a frequency of less than 50,000 electrons per second. A ion species injector 65 directs the beam of electrons 67 to a position intersecting un-charged targets 82 output from the fuel target generator 30. Electrons from the electron beam attach to the un-charged targets 82 to generate charged targets 82.

In some embodiments, the targets 82 are heated by the beam of electrons 67 to create a target mist of lower-density for full ionization for light emission. The beam of electrons 67 may be projected to targets 82 in a zone which is closer to the fuel target generator 30 than the zone where the pre-pulse laser 42 irradiates. However, it should be appreciated that many variations and modifications can be made to embodiments of the disclosure. The beam of electrons 67 may be projected to targets 82 in a zone which is farther away from the fuel target generator 30 than the zone where the pre-pulse laser 42 irradiates. In some embodiments, the first laser source 40 is omitted.

Embodiments of a method for generating a high-brightness light are provided. By introducing gaseous material into targets and expanding the gas-containing target mists before excitation, the interaction area between targets and irradiation is increased. Therefore, light emission conversion efficiency is enhanced, and contamination of the light emitting system by debris is reduced.

In accordance with some embodiments, a method for generating high-brightness light is provided. The method includes introducing a gaseous material into the target material. The method further includes supplying the target material into a fuel target generator. The method also includes generating targets by forcing the target material with the gaseous material out of the fuel target generator. In addition, the method includes expanding the gaseous material in the targets to transform the targets to target mists. The method also includes focusing a main pulse laser on the target mists to generate plasma emitting high-brightness light.

In accordance with some embodiments, a method for generating high-brightness light is provided. The method includes delivering targets through a fuel target generator. The method further includes expanding the targets to target mists. The targets include gaseous material. The method also includes focusing a main pulse laser on the target mists to generate plasma that emits high-brightness light.

In accordance with some embodiments, a high-brightness light source is provided. The high-brightness light source includes a fuel target generator. The fuel target generator is configured to generate targets containing gaseous material. The high-brightness light source further includes a pre-pulse laser. The high-brightness light source also includes a main pulse laser having a higher energy than the pre-pulse laser. In addition, the high-brightness light source also includes a controller. The controller is configured to fire the pre-pulse laser and the main pulse laser to hit the targets in sequence.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for generating high-brightness light, comprising:
   generating a gaseous material in a target material, wherein the gaseous material comprises a gas compound;
   decomposing the gas compound in the target material to a gaseous phase product;
   supplying the target material having the gaseous phase product into a fuel target generator;
   generating targets by forcing the target material with the gaseous material out of the fuel target generator;
   expanding the gaseous material in the targets to transform the targets to target mists; and
   focusing a main pulse laser on the target mists to generate plasma that emits high-brightness light.

2. The method for generating high-brightness light as claimed in claim 1, wherein the expansion of the gaseous material in the targets comprises focusing a pre-pulse laser having a lower energy than the main pulse laser on the targets prior to the main pulse laser hitting the targets.

3. The method for generating high-brightness light as claimed in claim 1, wherein the expansion of the gaseous material in the targets comprises projecting a thermal current over the targets.

4. The method for generating high-brightness light as claimed in claim 1, wherein the generation of the gaseous material in the target material comprises supplying the gaseous material into the target material in the fuel target generator.

5. The method for generating high-brightness light as claimed in claim 4, wherein the gaseous material comprises hydrogen or inert gas comprising helium, argon, neon, or their compound.

6. The method for generating high-brightness light as claimed in claim 1, wherein the gas compound comprises stannane.

7. A method for generating high-brightness light, comprising:
   providing ions into a target material to generate a gaseous material in the target material;
   delivering targets through a fuel target generator;
   expanding the targets to target mists, wherein the targets comprise the gaseous material; and
   focusing a main pulse laser on the target mists to generate plasma that emits high-brightness light.

8. The method for generating high-brightness light as claimed in claim 7, wherein the expansion of the targets to the target mists comprises focusing a pre-pulse laser having a lower energy than the main pulse laser on the targets prior to the main laser hitting the targets.

9. The method for generating high-brightness light as claimed in claim 7, wherein the expansion of the targets to the target mists comprises projecting a thermal current over the targets.

10. The method for generating high-brightness light as claimed in claim 7, wherein the gaseous material is generated in the target material contained in the fuel target generator.

11. The method for generating high-brightness light as claimed in claim 10, wherein the generation of the gaseous material in the target material comprises:
   allowing the ions to interact with ions of opposite charge in the fuel target generator so as to generate the gaseous material.

12. The method for generating high-brightness light as claimed in claim 7, wherein the gaseous material is generated in the target material contained in a storage tank; and
   delivering the target material with the gaseous material into the fuel target generator.

13. A high-brightness light source, comprising:
   means for providing ions to generate a gaseous material in a target material;
   a fuel target generator configured to generate a plurality of targets from the target material that contains the gaseous material;
   a pre-pulse laser;
   a main pulse laser having a higher energy than the pre-pulse laser; and
   a controller configured to fire the pre-pulse laser and the main pulse laser to hit the targets in sequence.

14. The high-brightness light source as claimed in claim 13, further comprising a thermal device configured for projecting a thermal current over the targets.

15. The high-brightness light source as claimed in claim 13, wherein the means comprises an ion beam generator connected to the fuel target generator and configured to provide the ions into the fuel target generator to interact with opposite ions in the fuel target generator so as to generate the gaseous material.

16. The high-brightness light source as claimed in claim 13, further comprising:
   a storage tank configured to supply a target material to the fuel target generator;
   wherein the means comprises an ion beam generator connected to the storage tank and configured to provide the ions into the storage tank to interact with opposite ions in the storage tank so as to generate the gaseous material.

17. The method for generating high-brightness light as claimed in claim 1, wherein the gas compound is decomposed after the gas compound is blended into the target material.

18. The method for generating high-brightness light as claimed in claim 17, wherein the gas compound is blended via a blending member.

19. The method for generating high-brightness light as claimed in claim 12, further comprising allowing the ions to interact with ions of opposite charge in the storage tank so as to generate the gaseous material.

20. The high-brightness light source as claimed in claim 15, wherein the fuel target generator further comprises a charging circuit configured to provide the opposite ions in the fuel target generator.

* * * * *